(12) United States Patent
Arbel et al.

(10) Patent No.: US 10,410,694 B1
(45) Date of Patent: Sep. 10, 2019

(54) HIGH BANDWIDTH CHIP-TO-CHIP INTERFACE USING HBM PHYSICAL INTERFACE

(71) Applicant: Xilinx, Inc., San Jose, CA (US)

(72) Inventors: Ygal Arbel, Morgan Hill, CA (US); Sagheer Ahmad, Cupertino, CA (US); Balakrishna Jayadev, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/048,084

(22) Filed: Jul. 27, 2018

(51) Int. Cl.
  *G11C 7/10* (2006.01)
  *G06F 11/10* (2006.01)
  *G06F 3/06* (2006.01)

(52) U.S. Cl.
  CPC .......... *G11C 7/1096* (2013.01); *G06F 3/061* (2013.01); *G06F 3/0629* (2013.01); *G06F 3/0658* (2013.01); *G06F 11/1044* (2013.01); *G11C 7/1069* (2013.01)

(58) Field of Classification Search
  CPC ..... G11C 7/1096; G11C 7/1069; G06F 3/061; G06F 3/0629; G06F 3/0658; G06F 11/1044; G06F 13/4221; G06F 2213/0026; G06F 2009/45595; G06F 9/45558
  USPC .............. 365/189.16, 63, 189.15, 189.17
  See application file for complete search history.

(56) References Cited

U.S. PATENT DOCUMENTS

2017/0192706 A1* 7/2017 Fujimoto ............... G11C 5/14
2019/0042518 A1* 2/2019 Marolia ............ G06F 13/4221

* cited by examiner

*Primary Examiner* — Tan T. Nguyen
(74) *Attorney, Agent, or Firm* — Robert M. Brush

(57) ABSTRACT

Techniques related to a high bandwidth interface (HBI) for communication between multiple host devices on an interposer are described. In an example, the HBI repurposes a portion of the high bandwidth memory (HBM) interface, such as the physical layer. A computing system is provided. The computing system includes a first host device and at least a second host device. The first host device is a first die on an interposer and the second host device is a second die on the interposer. The first host device and the second host device are interconnected via at least one HBI. The HBI implements a layered protocol for communication between the first host device and the second host device. The layered protocol includes a physical layer protocol that is configured according to a HBM physical layer protocol.

20 Claims, 24 Drawing Sheets

| FUNCTION | COUNT | DIRECTION | NOTES |
|---|---|---|---|
| DATA | 128 | BIDIRECTIONAL | ONE 128-BIT CHANNEL OR 2 64-BIT PSEUDO-CHANNELS |
| COMMAND/ADDRESS | 14 | INPUT | 6 ROW, 8 COLUMN COMMAND BITS |
| DBI | 16 | BIDIRECTIONAL | DATA BUS INVERSION, ONE BIT PER 8-BITS OF DATA |
| DM/ECC | 16 | BIDIRECTIONAL | DATA MASK OR ECC, ONE BIT PER 8-BITS OF DATA |
| PAR | 4 | BIDIRECTIONAL | PARITY, ONE BIT PER 32-BITS OF DATA |
| DERR | 4 | OUTPUT | DATA ERROR INDICATION, ONE BIT PER 32-BITS OF DATA |
| READ DQS | 8 | OUTPUT | ONE DIFFERENTIAL STROBE SIGNAL PER 32-BITS OF DATA |
| WRITE DQS | 8 | INPUT | ONE DIFFERENTIAL STROBE SIGNAL PER 32-BITS OF DATA |
| CLOCK | 2 | INPUT | DIFFERENTIAL |
| CKE | 1 | INPUT | CLOCK ENABLE |
| AERR | 1 | OUTPUT | ADDRESS ERROR INDICATION |
| REDUNDANT WIRES | 10 | | 8 DATA, ONE ROW, ONE COLUMN BITS |

FIG. 3

| SIGNAL | WIDTH [BITS] | DESCRIPTION |
|---|---|---|
| DATA | 256 | DATA BUS |
| CFLAG | 1 | CONTROL FLAG, MAY BE USED TO DISTINGUISH BETWEEN CONTROL WORDS (CFLAG=1) AND DATA WORDS (CFLAG=0) |
| CREDIT | 2 | CREDITS, USED TO ISSUE FLOW CONTROL CREDITS FOR ANOTHER CHANNEL IN THE OPPOSITE DIRECTION |
| USER | 20 | USER DATA, A SIDE CHANNEL FOR GENERAL PURPOSE USE |
| VALID | 1 | INDICATES DATA IS VALID (AN ACTIVE CYCLE), VALID SHOULD BE SET ONLY IF CREDITS ARE AVAILABLE |

| L0 CHANNEL | L0 SIGNAL | L1 SIGNALS TRANSPORTED |
|---|---|---|
| 0,1 | DQ[31:0] | 256 BITS OF DATA |
| 0,1 | DBI[3:0] | USED FOR DBI |
| 0,1 | PAR | USED FOR PARITY |
| 0,1 | DM[0] | USED FOR FRAMING |
| 0 | DM[3:1] | USED FOR 12 USER BITS |
| 1 | DM[3:1] | USED FOR 12 REMAINING BITS: 8 USER, 1 CFLAG, 2 CREDIT, 1 VALID |

FIG. 10

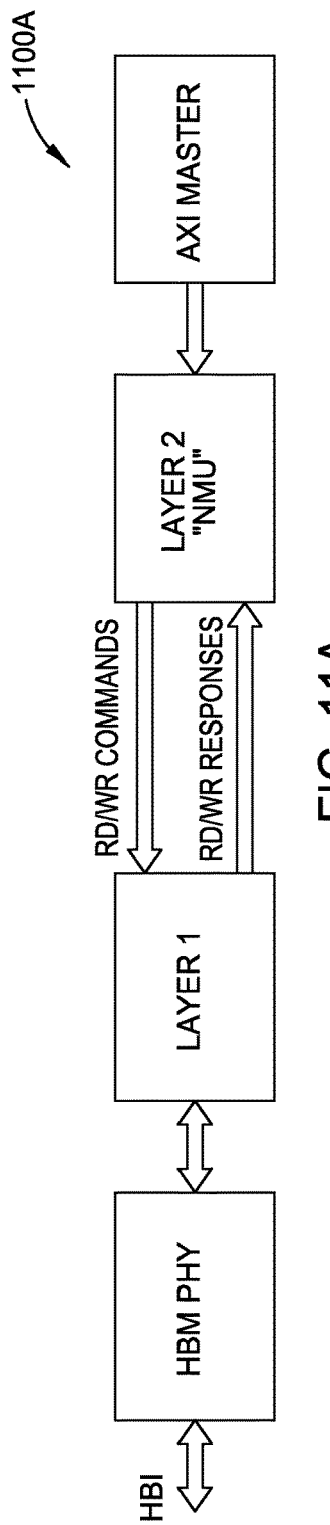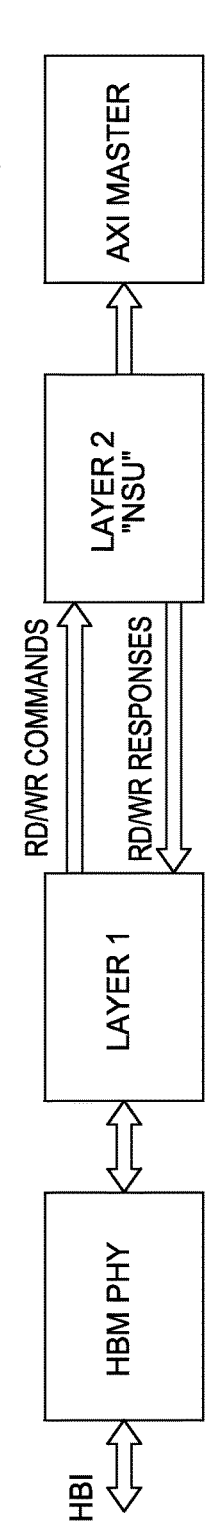
FIG. 11A
FIG. 11B

| SIGNAL | WIDTH [BITS] | DESCRIPTION |
|---|---|---|
| AxADDR | 64 | READ OR WRITE CHANNEL ADDRESS |
| ID | 8 | AXI ID |
| LEN | 8 | BURST LENGTH |
| SIZE | 3 | BURST SIZE, A 3-BIT CODE COVERING THE RANGE 1-32 BYTES PER BEAT |
| MISC | 8 | INCLUDES AxCACHE, AxLOCK, AxBURST, AxPROT |
| WSTRB | 32 | WRITE STROBE SIGNAL, SOME RESTRICTIONS APPLY, AND ONLY 10 BITS SHALL BE ENCODED AND TRANSPORTED |
| AxUSER | 16 | USER BITS ASSOCIATED WITH THE ADDRESS CHANNEL |
| xUSER | 0 | USER BITS ASSOCIATED WITH THE DATA CHANNELS |
| BUSER | 0 | WRITE RESPONSE USER BITS |

FIG. 12

| HTYPE(4) | ADDR(64) | AXI_ID(8) | SIZE(3) | LEN(8) | MISC(8) | STRB(10) | AWUSER(16) | Res(7) |

| HTYPE(4) | ADDR(64) | AXI_ID(8) | SIZE(3) | LEN(8) | MISC(8) | Res(10) | AWUSER(16) | Res(7) |

| HTYPE(4) | res(64) | res(8) | res(3) | res(8) | res(8) | res(10) | res(16) | Res(7) |

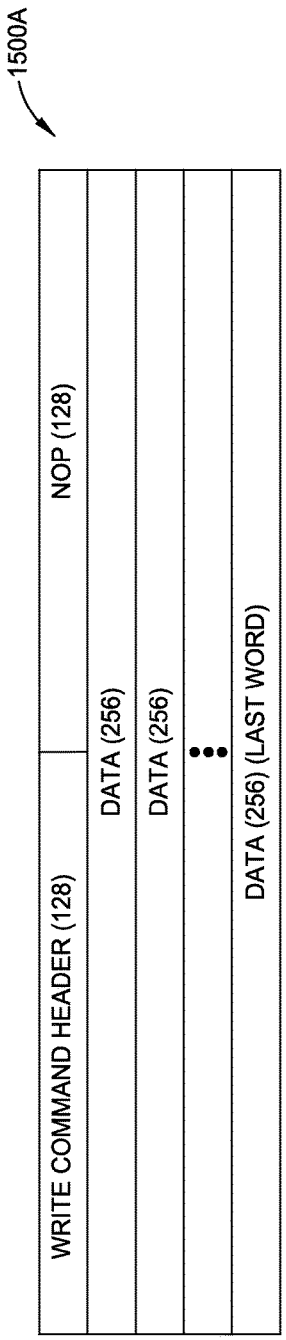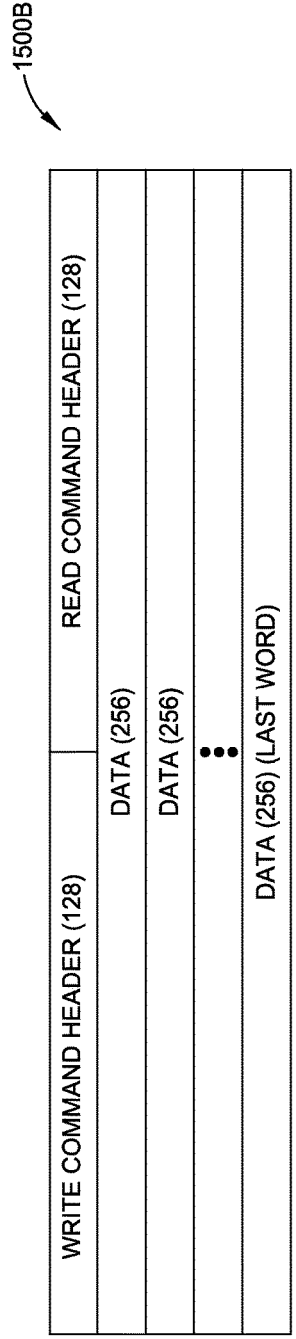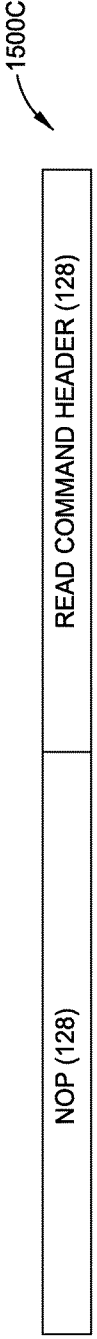

| WRESP(7) | RV(1) | RLAST(1) | RRESP(2) | RID(8) | RDATA(256) |

| START(1)=1 | WV(1) | WID(5) |

| START(1)=0 | WID(3) | WRESP(2) | Res(1) |

| SIGNAL | WIDTH [BITS] | DESCRIPTION |
|---|---|---|
| TSTRB/TKEEP | 6 | ENCODED, RESTRICTIONS APPLY |
| TID/TDEST | 8 | AXI ID |
| TLAST | 1 | LAST WORD FLAG |
| TUSER | 5 | USER BITS |

FIG. 17

| VALUE | MEANING |
|---|---|
| 0-31 | LOCATION OF THE FIRST VALID BYTE LOCATION IN NON-LAST WORD, OR LOCATION OF FIRST INVALID BYTE IN LAST WORD |
| 32 | INDICATES THAT ALL BYTES ARE VALID |

| MODE | ALLOCATED TID BITS | ALLOCATED TDEST BITS |
|---|---|---|
| 0 | 0 | 8 |
| 1 | 2 | 6 |
| 2 | 4 | 4 |
| 3 | 6 | 2 |
| 4 | 8 | 0 |

FIG. 19

| | |
|---|---|
| DWORD0 CHANNEL e | DWORD0 CHANNEL a |
| DWORD0 CHANNEL f | DWORD0 CHANNEL b |
| DWORD1 CHANNEL e | DWORD1 CHANNEL a |
| DWORD1 CHANNEL f | DWORD1 CHANNEL b |
| AWORD CHANNEL e | AWORD CHANNEL a |
| AWORD CHANNEL f | AWORD CHANNEL b |
| DWORD2 CHANNEL e | DWORD2 CHANNEL a |
| DWORD2 CHANNEL f | DWORD2 CHANNEL b |
| DWORD3 CHANNEL e | DWORD3 CHANNEL a |
| DWORD3 CHANNEL f | DWORD3 CHANNEL b |
| RESET, IEEE1500 PORT, TEMPERATURE ||
| DWORD0 CHANNEL g | DWORD0 CHANNEL c |
| DWORD0 CHANNEL h | DWORD0 CHANNEL d |
| DWORD1 CHANNEL g | DWORD1 CHANNEL c |
| DWORD1 CHANNEL h | DWORD1 CHANNEL d |
| AWORD CHANNEL g | AWORD CHANNEL c |
| AWORD CHANNEL h | AWORD CHANNEL d |
| DWORD2 CHANNEL g | DWORD2 CHANNEL c |
| DWORD2 CHANNEL h | DWORD2 CHANNEL d |
| DWORD3 CHANNEL g | DWORD3 CHANNEL c |
| DWORD3 CHANNEL h | DWORD3 CHANNEL d |

FIG. 20

| DM0 | DM1 | DM2 | DM3 |
|---|---|---|---|
| DQ0 | DQ8 | DQ16 | DQ24 |
| DQ1 | DQ9 | DQ17 | DQ25 |
| DQ2 | DQ10 | DQ18 | DQ26 |
| DQ3 | DQ11 | DQ19 | DQ27 |
| PAR | WDQS_t | RDQS_t | DERR |
| RD0 | WDQS_c | RDQS_c | RD1 |
| DQ4 | DQ12 | DQ20 | DQ28 |
| DQ5 | DQ13 | DQ21 | DQ29 |
| DQ6 | DQ14 | DQ22 | DQ30 |
| DQ7 | DQ15 | DQ23 | DQ31 |
| DB10 | DB11 | DB12 | DB13 |

FIG. 21

| SIGNAL | DIRECTION IN MASTER | DIRECTION IN SLAVE |
|---|---|---|
| WDQS_t/c | OUTPUT | INPUT |
| REQS_t/c | INPUT | OUTPUT |
| DERR | INPUT | OUTPUT |

FIG. 22

| TOP | BOTTOM |
|---|---|
| DQ0 | DQ31 |
| DQ1 | DQ30 |
| DQ2 | DQ29 |
| DQ2 | DQ29 |
| DQ3 | DQ28 |
| PAR | DQ27 |
| DQ4 | DQ26 |
| DQ5 | DQ25 |
| DQ6 | DQ24 |
| DQ7 | DQ23 |
| DQ8 | DQ22 |
| DQ9 | DQ21 |
| DQ10 | DQ20 |
| DQ11 | DQ19 |
| DQ12 | DQ18 |
| DQ13 | DQ17 |
| DQ14 | DQ16 |
| DQ15 | DQ15 |
| DM0 | DBI3 |
| DM1 | DBI2 |
| DM2 | DBI1 |
| DM3 | DBI0 |
| DQ16 | DQ14 |
| DQ17 | DQ13 |
| DQ18 | DQ12 |
| DQ19 | DQ11 |
| DQ20 | DQ10 |
| DQ21 | DQ9 |
| DQ22 | DQ8 |
| ⋮ | |
| DQ27 | PAR |
| DQ28 | DQ3 |
| ⋮ | |
| DQ31 | DQ0 |
| WDQSx | RDQSx |
| RDQSx | WDQSx |
| DERR | – |
| DBI0 | DM3 |
| DBI1 | DM2 |
| DBI2 | DM1 |
| DBI3 | DM0 |

FIG. 23B

HIGH BANDWIDTH CHIP-TO-CHIP INTERFACE USING HBM PHYSICAL INTERFACE

TECHNICAL FIELD

Examples of the present disclosure generally relate to electronic circuits and, in particular, to a high bandwidth chip-to-chip interface using the high bandwidth memory (HBM) physical interface.

BACKGROUND

Electronic devices, such as tablets, computers, copiers, digital cameras, smart phones, control systems and automated teller machines, among others, often employ electronic components such as dies that are connected by various interconnect components. The dies may include memory, logic or other integrated circuit (IC) device.

ICs may be implemented to perform specified functions. Example ICs include mask-programmable ICs, such as general purpose ICs, application specific integrated circuits (ASICs), and the like, and field programmable ICs, such as field programmable gate arrays (FPGAs), complex programmable logic devices (CPLDs), and the like.

ICs have become more "dense" over time, i.e., more logic features have been implemented in an IC. More recently, Stacked-Silicon Interconnect Technology ("SSIT") allows for more than one semiconductor die to be placed in a single package. SS IT ICs may be used to address increased demand for having various ICs within a single package. Conventionally, SSIT products are implemented using an interposer that includes an interposer substrate layer with through-silicon-vias (TSVs) and additional metallization layers built on top of the interposer substrate layer. The interposer provides connectivity between the IC dies and the package substrate.

Chip-to-chip interfaces (also called interconnects) provide a bridge between host devices, such as between ICs, system-on-chip (SoCs), FPGAs, ASICs, central processing units (CPUs), graphic processing units (GPUs), etc.

As the data rates which can be processed by systems increases, providing interfaces that can keep up with the processing speed of the chip becomes increasingly difficult. Power-efficient, robust, and low-cost chip-to-chip interfaces are desirable to meet the needs of high-performance systems.

High speed chip-to-chip interfaces sometime involve tradeoffs between pin count, input/output (I/O) die area, power, etc. Some examples of chip-to-chip interfaces include low voltage complementary metal oxide semiconductor (LVCMOS) I/O, low voltage differential signaling (LVDS) I/O, high speed serializer/deserializer (SERDES) I/O.

High bandwidth memory (HBM) is a high-performance random access memory (RAM) interface for 3D-stacked dynamic RAM (DRAM) and has been adopted by the Joint Electron Device Engineering Council (JEDEC) standards body. The HBM standard defines a new type of physical interface for communication between an HBM DRAM device and a host device such as an ASIC, CPU, GPU, or FPGA. The HBM physical interface can improve tradeoff point as far as I/O die area and power as compared to certain other interfaces. HBM can achieve high bandwidth using less power in a small form factor.

For some systems, a high speed interface is desirable to efficiently integrate other host devices on a single interposer. Thus, techniques for a high bandwidth chip-to-chip interface would be useful.

SUMMARY

Techniques related to a high bandwidth chip-to-chip interface using the high bandwidth memory (HBM) physical interface are described.

In an example, a computing system is provided. The computing system includes a first host device and at least a second host device. The first host device is a first die on an interposer and the second host device is a second die on the interposer. The first host device and the second host device are interconnected via at least one high bandwidth interface (HBI). The HBI implements a layered protocol for communication between the first host device and the second host device. The layered protocol includes a physical layer protocol that is configured according to a high bandwidth memory (HBM) physical layer protocol.

In another example, a method for communication between devices on an interposer is provided. The method includes sending at least a first signal from a first device on the interposer to a second device on the interposer via a HBI. Sending the first signal via the HBI includes sending the first signal using a layered protocol. The layered protocol includes a physical layer protocol that is configured according to a HBM physical layer protocol. The method includes receiving at least a second signal from the second device on the interposer via the HBI.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIG. 3 is a table summarizing the interface signals of a single 128-bit channel in HBM according to an example.

FIG. 9 is a table summarizing the HBI transport layer user-side interface according to an example.

FIG. 10 is a table mapping transport layer signals to available HBI PHY input/output (I/O) signals according to an example.

FIG. 11A shows a memory-mapped HBI protocol layer mapped to an inbound and outbound transport layer channel with a master-outbound slave-inbound channel interface according to an example.

FIG. 11B shows a memory-mapped HBI protocol layer mapped to an inbound and outbound transport layer channel with a master-inbound slave-outbound channel interface according to an example.

FIG. 12 is a table summarizing features of a memory-mapped HBI protocol layer interface according to an example.

FIG. 14A shows the packet header format for the memory-mapped HBI protocol layer Write Command packet according to an example.

FIG. 14B shows the packet header format for the memory-mapped HBI protocol layer Read Command packet according to an example.

FIG. 14C shows the packet header format for the memory-mapped HBI protocol layer No Operation packet according to an example.

FIG. 15A shows a memory-mapped HBI protocol layer command channel Write Command packet format according to an example.

FIG. 15B shows a memory-mapped HBI protocol layer command channel mixed Write and Read Command packet format according to an example.

FIG. 15C shows a memory-mapped HBI protocol layer command channel Read Command packet format according to an example.

FIG. 16A shows a memory-mapped HBI protocol layer response channel Write and Read Response format according to an example.

FIG. 16B shows a memory-mapped HBI protocol layer response channel Write Response packet format for a first cycle according to an example.

FIG. 16C shows a memory-mapped HBI protocol layer response channel Write Response packet format for a second cycle according to an example.

FIG. 17 is a table showing streaming HBI protocol layer signals according to an example.

FIG. 18 is a table showing the encoding of the TKEEP signal for the streaming HBI L2 protocol according to an example.

FIG. 19 is a table showing bit allocations for TID and TDEST for the streaming HBM protocol according to an example.

FIG. 20 illustrates an example ball layout for HBI with data flowing horizontally from chip to chip according to an example.

FIG. 21 illustrates an example ball layout for HBI following with data flowing vertically from chip to chip according to an example.

FIG. 22 is a table showing HBI PHY signal directions for master and slave devices according to an example.

FIGS. 23A-23B show wiring connections between different-orientation dies for HBI according to an example.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
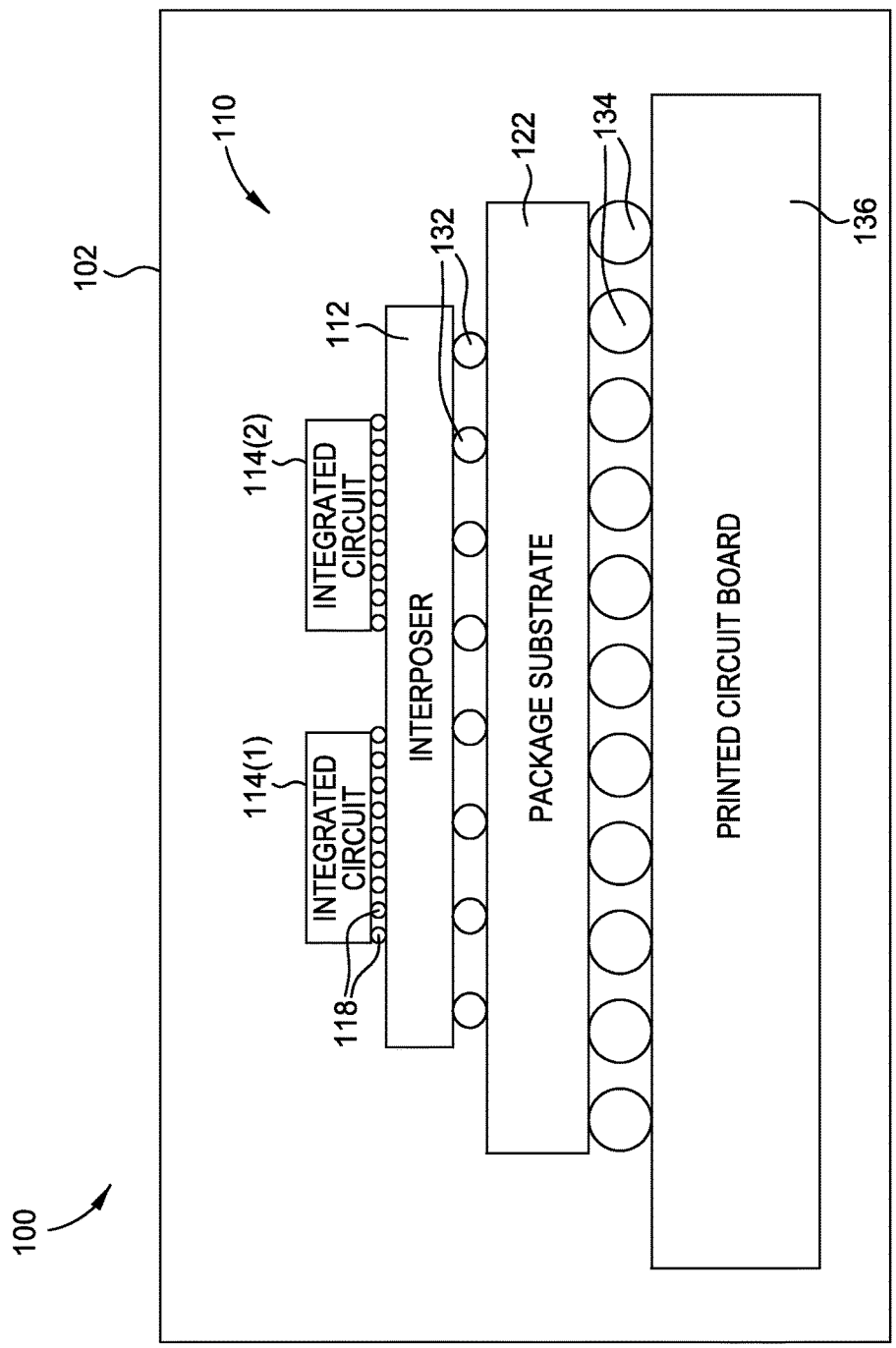
FIG. 1 is a cross-sectional schematic diagram illustrating example stacked silicon interconnect technology (SSIT) product that utilizes an interposer according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Examples of the disclosure relate to techniques and apparatus for high bandwidth interface (HBI), such as a high speed chip-to-chip interface, at least partially using the high bandwidth memory (HBM) physical interface to efficiently integrate host devices on a single interposer. In some examples, the HBI interface uses HBM at the physical layer (PHY) and uses different protocols or adjustments of the HBM for other layers.

Before describing exemplary implementations illustratively depicted in the several figures, a general introduction is provided to further understanding.

An Example Silicon Stack Interconnect Technology (SSIT) Product

Silicon stacked interconnect technology (SSIT) involves packaging multiple integrated circuit (IC) dies into a single package that includes an interposer and a package substrate. Utilizing SSIT expands IC products, such as and including FPGA products and other types of products, into higher density, lower power, greater functionality, and application specific platform solutions with low cost and fast-to-market advantages.

FIG. 1 is a cross-sectional schematic diagram illustrating an exemplary SSIT product (electronic device 100) according to an example implementation. The electronic device 100 includes an integrated chip package 110 disposed in a housing 102. The electronic device 100 may be used in a computer, tablet, cell phone, smart phone, consumer appliance, control system, automated teller machine, programmable logic controller, printer, copier, digital camera, television, monitor, stereo, radio, radar, or other device.

The integrated chip package 110 includes a plurality of IC dies 114 (e.g., IC dies 114(1) and 114(2) are shown by example) connected optionally by a silicon-through-via (TSV) interposer 112 (also referred to as "interposer 112") to a package substrate 122. The chip package 110 may also have an overmold covering the IC dies 114 (not shown). The interposer 112 includes circuitry (not shown) for electrically connecting the IC dies 114 to circuitry (not shown) of the package substrate 122. The circuitry of the interposer 112 may optionally include transistors. Package bumps 132, also known as "C4 bumps," are utilized to provide an electrical connection between the circuitry of the interposer 112 and the circuitry of the package substrate 122. The package substrate 122 may be mounted and connected to a printed circuit board (PCB) 136, utilizing solder balls 134, wire bonding or other suitable technique. The PCB 136 can be mounted in the interior of a housing 102 of the electronic device 100.

The IC dies 114 are mounted to one or more surfaces of the interposer 112, or alternatively, to the package substrate 122. The IC dies 114 may be programmable logic devices, such as FPGAs, memory devices, optical devices, processors or other IC logic structures. In the example depicted in FIG. 1, the IC dies 114 are mounted to a top surface of the interposer 112 by a plurality of micro-bumps 118. The micro-bumps 118 electrically connect the circuitry of each IC die 114 to circuitry of the interposer 112. The circuitry of the interposer 112 connects the micro-bumps 118 to package bumps 132, and hence, connects selective circuitry of each IC dies 114 to the package substrate 122, to enable communication of the IC dies 114 with the PCB after the chip package 110 is mounted within the electronic device 100. When the interposer 112 is not present, the micro-bumps 118 connect selective circuitry of each IC die 114 to the package substrate 122 to enable communication of the IC dies 114 with the PCB after the chip package 110 is mounted within the electronic device 100. Although not shown, it is contemplated that one or more additional IC dies may be stacked on one or both of the IC dies 114.

The electrical components of integrated chip package 110, such as the IC dies 114, communicate via traces formed on electrical interconnect components. The interconnect components having the traces can include one or more of the PCB 136, the package substrate 122 and interposer 112, among others components.

As mentioned, currently, The HBM standard defines a new type of physical interface for communication between an HBM DRAM device and a host device such as an ASIC, CPU, GPU, or FPGA. In one example, the printed circuit board 136 is a graphics card and the IC 114(1) is a GPU. In this case, the IC 114(1) may include a 3D engine, a display controller, and an HBM controller; and the IC 114(2) may include stacked DRAM dies and an optional base HBM controller die interconnected by through-silicon vias (TSVs) and microbumps. The interface is divided into independent channels, each operating as a data bus.

In some examples, HBM devices have up to 8 independent DRAM channels. Each DRAM channel includes two 64-bit data channels known as a pseudochannel (PC), and one command/address channel shared by the two PCs. Each PC can operate at a maximum data rate of 2000 MT/sec, double data rate, using a 1000 MHz clock. HBM features include: typically a die stack with 1-2 channels per die; 8×128b independent channels; 8 or 16 banks with optional bank grouping; 1 Kb page size; 1-8 Gbit of storage per channel; 2 Gbps (1 GHz) operation (32 GByte/sec per 128 bit channel); burst length (BL) of 4, thus, minimum access unit per PC is 32 bytes; 1.2 V (+/−5%) I/O and core voltage (independent); 2.5 V (+/−5%) pump voltage (VPP); unterminated I/O with nominal drive current 6-18 mA; write data mask (DM) support; error correcting code (ECC) support by using the DM signals, 16 bits per 128 b data (partial write not supported when ECC is used); data bus inversion (DBI) support; separate read and write data strobe (DQS) signals (differential); separate row and column command channels; command/address parity support; data parity support (in both directions); and address/data parity error indication. FIG. 3 is a table 300 summarizing the interface signals of a single 128-bit channel in HBM according to an example.

In some cases, however, it may be desirable to have a high-speed interface to interconnect multiple host devices, for example, on the interposer 112 (i.e., rather than a DRAM and a host device). Thus, aspects of the present disclosure relate implementing portions of the HBM interface as a high-speed interconnect between host devices, which may be on a same interposer.

Example Chip-to-Chip High Bandwidth Interface (HBI) Using HBM

Figure 2:
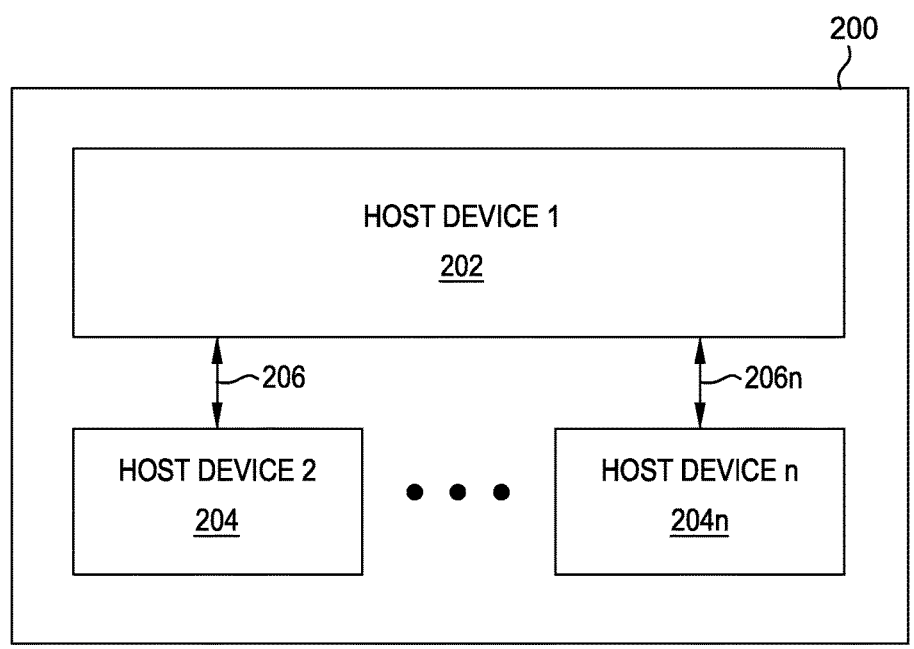
FIG. 2 is an example of host devices connected with a high bandwidth interface (HBI) according to an example.

FIG. 2 is an example of host devices connected with a high bandwidth interface (HBI) interface according to an example. As shown in FIG. 2, an interposer 200 may have a host device1 202 in communication with host device(s) 204 . . . 204n via HBI interface(s) 206 . . . 206n. The Host devices 202, 204 . . . 204n may be any type of host device, such as an ASIC, CPU, GPU, or FPGA. In some examples, host device1 202 is an all programmable device and the host device(s) 204 . . . 204n are ASICs. In some examples, the host device1 202 may be a 3D IC. In some examples, the host device1 202 may be also be in communication with a dummy device, an HBM DRAM, or other device, which may also be on the interposer 200. In some examples, the host device1 202 may have multiple interconnects (e.g., multiple HBI interfaces) with the same host device. In some examples, the host device(s) 204 . . . 204n may be client customer/user devices.

The HBI(s) 206 . . . 206n is a high performance chip-to-chip interface. The HBI(s) 206 . . . 206n may be at least partially based on the JEDEC HBM specifications. In some examples, the HBI interface uses the physical layer (PHY) and I/O as defined by the HBM specification, but uses different protocols or adjustments of the HBM for other layers. For example, since the HBI is an interconnect for host devices, the HBI may dispense with DRAM specific protocols of HBM.

HBI Compatibility with HBM

The HBI interface (e.g., HBI(s) 206 . . . 206n) may be compatible with HBM PHY and I/O at a date rate up to 2000 MT/s. In some examples, the HBI uses the PHY in a "bit-slice mode".

The HBI interface (e.g., HBI(s) 206 . . . 206n) may support a user-side interface at one-fourth the HBM data rate (e.g. 500 MHz). While the nominal HBM clock rate described herein may be 1000 MHz and the HBI user-side rate may be 500 MHz, other rates may be used as actual device rates may vary depending on implementation, speed grades, etc.

HBI Device Symmetry

Portions of the HBI interface may not be symmetrical between a master (e.g., controller) and a slave (e.g., DRAM). For example, the command/address channel is unidirectional.

To ensure symmetry and interoperability with either master or slave HBM PHY (or both simultaneously), the HBI interface (e.g., HBI(s) 206 . . . 206n) may use only a subset of the HBM standard interface which is symmetrical, i.e., which makes it possible for either side to transmit or receive data. For example, the HBM signals "Command/Address", "DERR", and "AERR" signals may not be used by the HBI interface.

HBI Multi-Channel Support

The HBI interface (e.g., HBI(s) 206 . . . 206n) may support multiple independent communication channels.

HBI Static Configuration

The HBI interface (e.g., HBI(s) 206 . . . 206n) may be configured and calibrated once at start time. In some examples, the HBI may require little or no maintenance after the initial configuration and calibration.

HBI Dual Simplex Operation

As mentioned above, the HBI interface (e.g., HBI(s) 206 . . . 206n) may provide multiple channels. Each channel may operate in one direction (e.g., output or input).

HBI Scalability

As mentioned above, the HBI interface (e.g., HBI(s) 206 . . . 206n) may provide multiple channels. The number of HBI channels may vary depending on the application. In some examples, an HBI may use an HBM PHY consisting of 8 128-bit data channels, however, a different number of channels may be used. An HBM PHY with 8×128-bit channels may be referred to as an "HBM PHY unit".

HBI Layered Protocol

Figure 4:
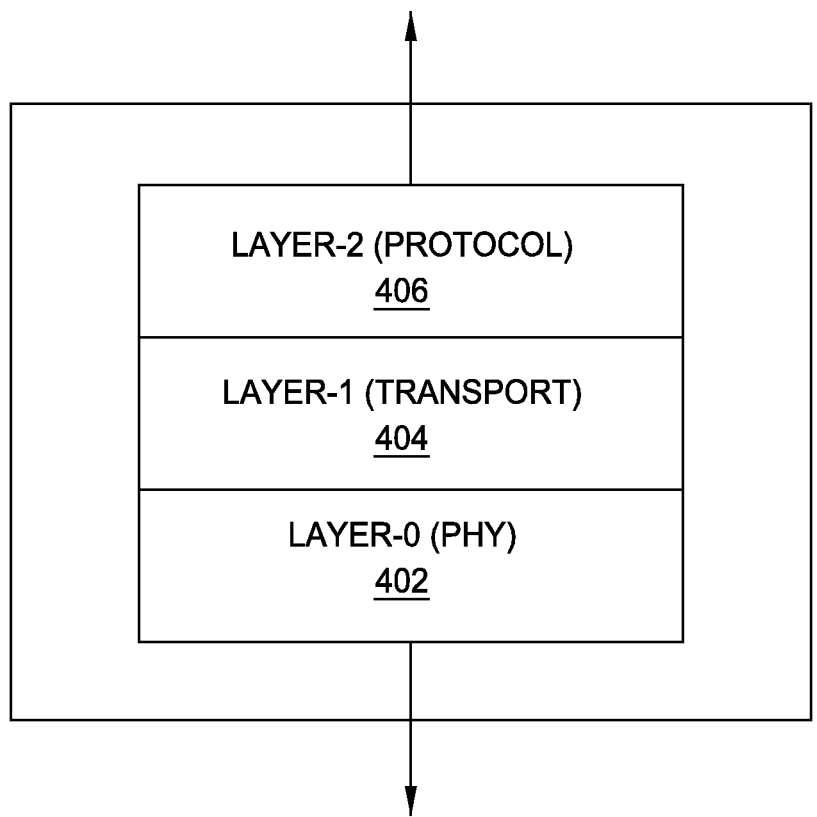
FIG. 4 is a block diagram of the HBI layered protocol according to an example.

The HBI interface (e.g., HBI(s) 206 . . . 206n) may support three protocol layers as shown in FIG. 4. The layered protocol may allow seamless chip-to-chip communication using a high level protocol and may provide flexibility to implement other high level protocols, for example, by only replacing the layer-2 protocol. The protocol layers includes the layer-0 402, a PHY layer (e.g., exposed HBM PHY); the layer-1 404, a transport layer that may provide basic data transport, parity, framing, and flow control; and the layer-2 406, a protocol layer. In some examples, the layer-0 402 is an HBM PHY. In some examples, the layer-2 is a mapping of the AXI4-MM or AXI4-S onto the layer-1.

The HBI interface (e.g., HBI(s) 206 . . . 206n) may use the physical interface as a general purpose communication channel between the chips (e.g., the host devices 202, 204 . . . 204n on the interposer 200. The PHY layer may be the first and lowest layer (also referred to as layer 0) and may refer to the circuitry that implements physical layer functions in communications. The PHY may define the electrical and physical specifications of the data connection.

The HBI layer-0 402 is the direct access to the HBM PHY. A "controller bypass" mode may be used in which PHY signals are directly exposed to the PL, and data flows continuously. The HBM standard defines eight 128-bit legacy channels, or sixteen 64-bit pseudo channels. The basic data unit in layer-0 402 is a 32-bit data word. Therefore, thirty-two layer-0 channels are available per HBM PHY unit. The HBM PHY may operate in a 4:1 SERDES (serializer/deserializer) mode, meaning that it provides bus-width conversion and corresponding clock speed conversion at a 4:1 ratio from the user's point of view.

In some examples, on the I/O side, each L0 (i.e., PHY) channel is 32-bit wide, operating at 1000 MHz DDR (2000 MT/s), while on the user side the L0 channel is seen as a single-data-rate 128-bit channel operating at 500 MHz. The subset of HBM signals available for L0 is summarized in the table 500 shown in FIG. 5, while on the user side, each L0 channel is seen as a 164-bit unidirectional data pipe (e.g., because data (DQ), data bit inversion (DBI), data mask (DM), and parity (PAR) signals are all treated the same way by the HBM PHY).

For the HBI PHY Internet Protocol (IP), only an HBM PHY may be needed. As discussed above, the HBM PHY may be directly accessible, the HBM PHY may be in a "bit slice mode" that allows continuous data flow per 32-bit I/O word, the I/O direction may selectable per 32-bit I/O word, and the HBM PHY may be in a 4:1 SERDES mode.

Figure 6:
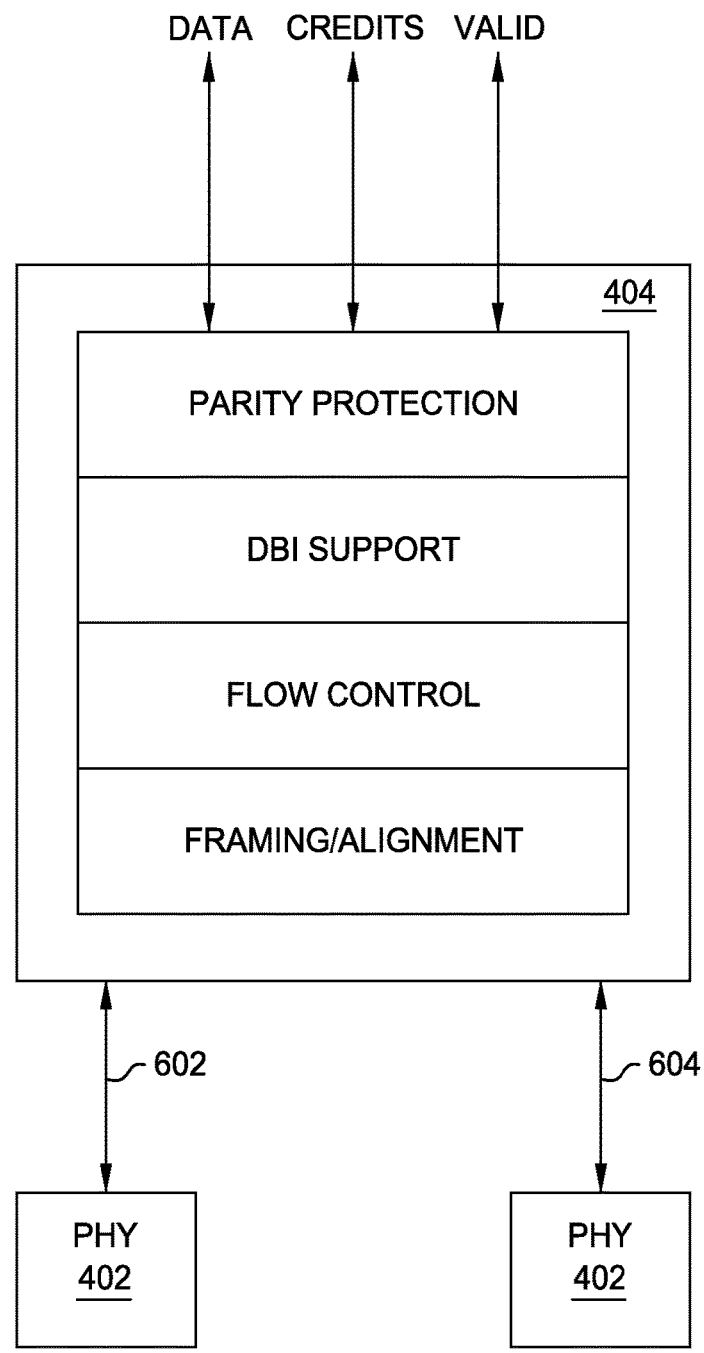
FIG. 6 illustrates the HBI transport layer protocol according to an example.

FIG. 6 illustrates the HBI transport layer protocol 404 (i.e., layer-1 or L1) according to an example. As shown in FIG. 6, the HBI layer-1 defines a transport protocol 404 on top of the PHY 402. The HBI L1 may have sixteen 256-bit unidirectional user channels (per HBM PHY unit). As shown in FIG. 6, the HBI L1 may provide parity protection, DBI support, flow control, and framing/alignment. As shown in FIG. 6, each HBI L1 channel may use two L0 channels 602, 604, thus, a total of sixteen L1 (data) channels are available per HBM PHY unit. Each HBI L1 channel may be configurable as input or output. Each HBI L1 channel may provide a 256-bit data bus in one direction (i.e., channel bus width), for example, by using the two L0 channels 602, 604.

The HBI L1 may provide the DBI functionality as defined in the HBM standard. The purpose of the DBI is to reduce I/O power by minimizing the number of transitions on the data bus.

The HBI L1 may provide the parity protection as defined in the HBM standard. For example, each 32-bit word is protected with one parity bit. The HBI L1 provides parity generation on the transmit side, and parity checking, error logging, and error reporting on the receive side. Error recovery can be implemented external to the HBI.

As shown in FIG. 6, the HBI L1 may provide a credit-based flow control mechanism. Since each channel is uni-directional, an output L1 channel can be used to issue credits used by another input L1 channel.

Figure 7:
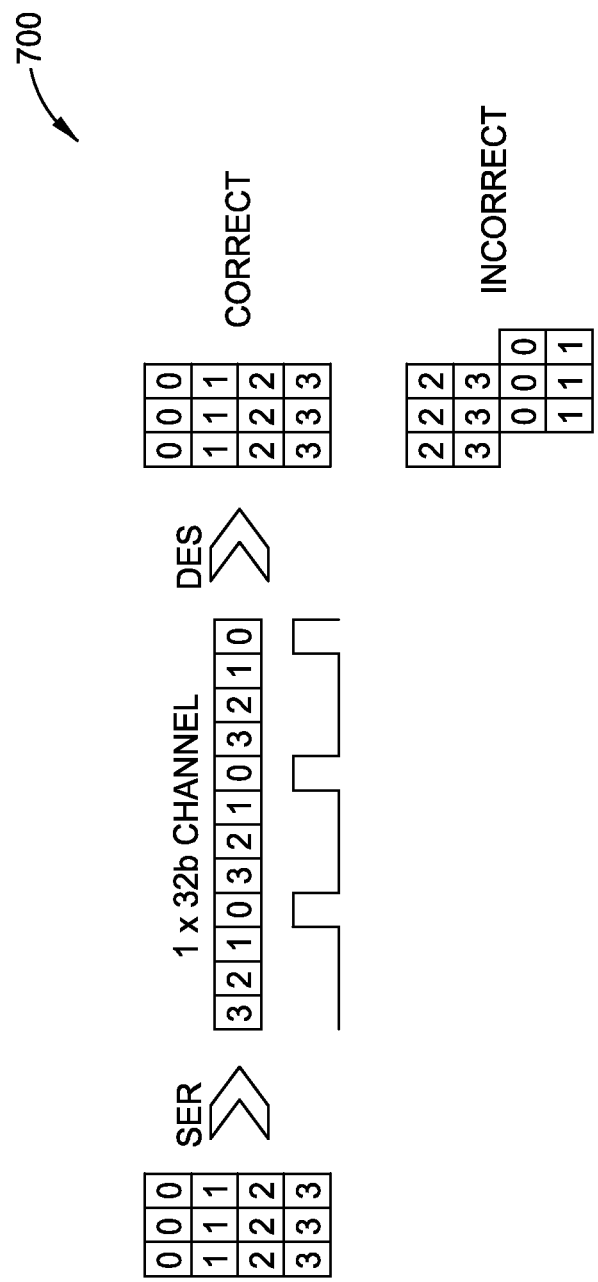
FIG. 7 illustrates intra-channel framing and alignment by the HBI transport layer protocol according to an example.
Figure 8:
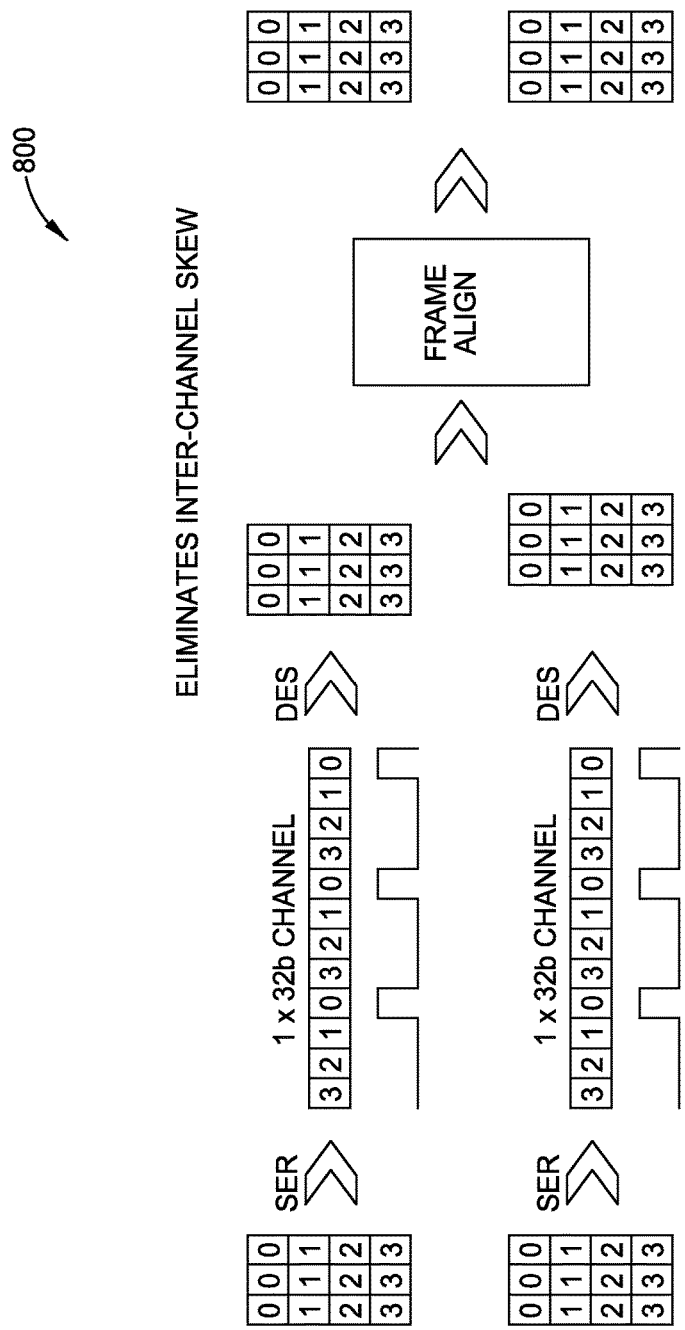
FIG. 8 illustrates inter-channel framing and alignment by the HBI transport layer protocol according to an example.

As shown in FIG. 6, the HBI L1 provides framing and alignment. The HBI L1 may provide intra-channel framing and alignment within an L0 channel 602, 604 as shown in FIG. 7 and inter-channel framing and alignment between the two L0 channels 602, 604 used by the L1 channel as shown in FIG. 8. In some examples, framing is achieved using framing signals sent along with the data to provide alignment and identification of the first word in the serialized sequence created by the PHY SEDES function.

The HBI L1 receive logic may be responsible for achieving and maintaining alignment, detecting alignment errors, and recovering from such errors. Alignment errors may be reported via a status/interrupt register.

The HBI L1 may reorder the bits from the L0, for example, prior to use. The reordering may depend on the die and PHY orientation.

The HBI L1 user-side interface may be defined as shown in the Table 900 in the FIG. 9. The HBI L1 provides a 280-bit interface at 500 MHz. All signals flow in the same direction (in or out) depending on how the L1 channel is configured. Table 1000 in FIG. 10 shows how the L1 signals are mapped to the available L0 I/O signals. Each L0 I/O signal may transport four L2 bits.

For the HBI L1 IP, the L1 function may be implemented as soft logic IP in the PL on the side of the host device1 202.

Ignoring the user side channel and other overhead signals, each HBI L1 channel may sustain a throughput of around 16 GBytes/sec. Total HBI L1 throughput per HBI (for 1 HBM PHY unit) is therefore 256 GBytes/sec, or 2.048 Tbits/sec.

Figure 5:
FIG. 5 is a table summarizing a subset of HBM signals available for the HBI physical layer (PHY) according to an example.

As shown in FIG. 5, the HBI protocol layer 406 (i.e., the layer-2 or L2) is on top of the L1. The HBI L2 is used to encapsulate high level protocols over L1. Given the flexible layered approach, multiple L2 implementations are possible. Different L2 may be implemented depending on the host device(s) 204 . . . 204n being used (e.g., for different customers). Two examples of the L2 includes a memory-mapped protocol (e.g., an AXI4 (L2m) L2 protocol) and a streaming protocol (e.g., an AXI4 (L2s) protocol).

The memory-mapped HBI L2 protocol is illustrated in FIGS. 11A-11B. The memory mapped HBI L2 protocol may use a 256-bit AXI MM interface at 500 MHz. As shown in FIGS. 11A-11B, the memory mapped HBI L2 protocol may map to two L1 channel—one inbound and one outbound. Thus, one HBM PHY unit can support 8 AXI-MM interfaces, which may be configurable as a master AXI or slave AXI. The AXI commands/responses (e.g., read/write) may be packetized. In FIG. 11A, the AXI-MM interface is configured as a node master unit (NMU), and local AXI masters can access remote AXI slaves on the other die. In FIG. 11B, the AXI-MM interface is configured as a node slave unit (NSU) and remote AXI masters on the other die can access local AXI slaves. Each L2 channel, whether NMU or NSU, uses two L1 channels, for example, as defined above.

The outbound master (inbound slave) channel is used for read and write commands, and the inbound master (outbound slave) channel is used for read and write responses. Each HBI L2 channel may support two virtual channels (VCs). The VCs may ensure independent forward progress of the read and write transactions. There may be separate flow control credit management per VC.

The HBI L2 may not employ read tags or reorder buffers. The HBI L2 may not support ECC.

Features of an HBI protocol layer AXI4 interface are summarized in the Table 1200 in FIG. 12.

Figure 13:
FIG. 13 is a table showing allowed write strobe (WSTRB) values for the memory-mapped HBI protocol layer interface according to an example.

In some systems, 32 bits of write strobe (WSTRB) are used per data beat for a 256-bit AXI bus 32 to allow any combination of write strobes. However, such flexibility, though allowed, is rarely required. The strobes are often used in single beat partial writes or unaligned burst writes—in both cases, the WSTRB pattern can be encoded with far fewer than 32 bits. In some examples, the memory-mapped HBI L2 may support only single-beat partial writes for WSTRB containing zeros. The WSTRB word has only one contiguous region of nonzero WSTRB bits. In the data beat there are only three contiguous strobe regions: region 1 in which all WSTRB bits are 0; region 2 in which all WSTRB bits are 1; and region 3 in which all WSTRB bits are 0. Such case can be fully described using two values—a value N1 describing the number of 0's in region 1 (0-31) and a value N2 describing the number of 1's in region 2 (1-32). 10 bits may be used for the encoding. In some examples, for multi-beat transactions, no partial writes are allowed, i.e. all WSTRB bits must be set. Multi-beat unaligned writes are chopped prior to entering the memory-mapped HBI L2. The memory-mapped HBI L2 hardware may include a detector for violations and debugging of WSTRB restrictions. Allowed WSTRB values are shown in the Table 1300 in the FIG. 13.

Transmissions in the memory-mapped HBI L2 may be packetized. The AXI4 protocol has five channels: write address, write data, write response, read address, read response. The memory-mapped HBI L2 may combines the write address and write data channels, and packetize the transactions into four VCs of packets: Write command packet (includes both address and data); Read command packet; Write response packet; and Read response packet. The command packets are outbound (from master to slave), while the response packets are inbound (from slave to master).

Each VC has separate flow control credit management and can make forward progress independent of other VCs. For example, the outbound channel can issue two credits per cycle, one each for the two inbound VCs, and the inbound channel can issue two credits per cycle, one each for the two outbound VCs. In some examples, the credits are per word, not per packet. Write commands and read commands share the same outbound memory-mapped HBI L2 channel, while read and write responses share the same inbound memory-mapped HBI L2 channel. Packetization improves throughput per wire and is widely used in network-on-chip (NoC) solutions. FIGS. 14A-14C show the packet header formats 1400A, 1400B, 1400C, for the Write Command packet, Read Command packet, and No Operation packet, respectively. A value of the HTYPE field (header type) may indicate the type of the packet header—for example, 0 for NoP, 1 for Read, 2 for Write. The packet headers may be 128-bit words. In some examples, two packet headers may be sent simultaneously on the same 256-bit word, for example, subject to flow control credit availability.

FIGS. 15A-15C show the memory-mapped HBI L2 command channel packet formats 1500A, 1500B, 1500C, for a Write Command packet, a mixed Write and Read Command packet (consumes both a read and a write credit), and a Read Command Packet, respectively. The command channel packet may not use the L1 20-bit user side channel. Multi-word command packets (i.e., write commands) are not interleaved. However, read command packets may be interleaved in between the words of a write command packet. The L1 CFLAG signal is used to distinguish between header words and data words.

The response channel carries read data, read response, and write response packets. FIGS. 16A-16C show the memory-mapped HBI L2 response channel packet formats 1600A, 1600B, 1600C, according to an example. Response packets have no header, and each word can be independently identified and routed. To achieve full read throughput in the presence of write traffic, simultaneous read and write responses may be provided in the response packets, as shown in FIG. 16A. As shown in FIG. 16A, each read response word may use 256 bits for data; 8 bits for AXI Read ID (RID); 2 bits for the response type (RRESP); 1 bit for last word indication (RLAST); and 1 bit to indicate read valid response (RV). As shown in FIGS. 16B and 16C, each write response word uses 8 bits for the AXI Write ID (WID); 2 bits for the response type (WRESP); and 1 bit to indicate write valid response (WV).

For maximum read throughput, the memory-mapped HBI L2 response channel may sustain a read response every cycle. The read response is allocated 256 bits of data and 12 bits of the L1 user side-channel. For maximum write throughput, a write response is may be performed at most once per two cycles, since the shortest write packet has one header word and one data word, and takes two cycles to transmit. Therefore, the write response can be transmitted over two cycles without loss of throughput. The write response channel may be allocated 7 bits of the L1 user side channel; 1 bit to mark the response start; and 6 bits for the first or second half of the 11-bit write response. The read response words (e.g., with different AXI ID) may be interleaved.

As discussed above, another example of the HBI L2 is a streaming protocol (e.g., such as an AXI4 (L2s) protocol). The streaming HBI L2 protocol may use a 256-bit AXI-S interface at 500 MHz mapped to one L1 channel. Thus, one HBM PHY unit can support 16 such AXI-S interfaces. The interface may be configurable as a master (outbound) or a slave (inbound). The streaming HBI L2 protocol may support credit-based flow control, full throughput (e.g., no packetization overhead), two mode of operation (e.g., a "Normal" mode and a "Simple" mode). The streaming HBI L2 protocol creates a 256-bit data stream. The AXI valid-ready handshake is replaced by credit-based flow control, and all other AXI-S signals are carried over the available 20 bits of the L1 user side channel. The Table 1700 in FIG. 17 shows the streaming HBI L2 protocol signal mapping.

The streaming HBI L2 protocol may not support the TSTRB signal. The TKEEP signal may be supported. In some examples, the TKEEP signal allows a streaming packet to start and end on an unaligned boundary, but otherwise the packet must contain a contiguous stream of valid bytes. In the first word of an AXI-S packet (TLAST=0), TKEEP indicates the location of the first valid byte; in the last word of an AXI-S packet (TLAST=1), TKEEP indicates the location of the first invalid byte; in other packet words TKEEP should not be used. FIG. 18 is a table 1800 showing the encoding of the TKEEP signal for the streaming HBI L2 protocol. The TKEEP encoding is done by the streaming HBI L2 protocol, but the user may ensure compliance with the restrictions.

TID may be the source ID. The TID may be useful if multiple streams are interleaved onto a single physical channel. The TDEST is the destination ID. The TDEST may be used to route streaming packets to their final destination. Depending on the application, either TID or TDEST may or may not be required. A total of 8 bits are allocated for both TID and TDEST. The user may choose one of the static configurations shown in the Table 1900 in FIG. 19, depending on the application.

The streaming HBI L2 protocol "simple" mode, may be a subset of AXI-S in which only flow control is provided. In some examples, the simple mode may be a point to point, single-source to single-destination stream, and provide continuous flow of whole words. In the simple mode, TID/TDEST, TSTRB/TKEEP, and TLAST signals may be omitted. Instead, the user may be given the full available 20 bits of the side channel as TUSER bit, to be used for any purpose.

For the HBI L2 IP, the L2 function may be implemented as soft logic IP in the PL on the side of the host device1 202.

HBI Reset, Initialization, and Calibration

The dies connected by the HBI, such as the host device 1 202 and the host device(s) 204 . . . 204*n*, may be reset and initialized independently. For HBI initialization, calibration, and data flow initiation it is assumed that there is one or more controller entities (e.g. a CPU) responsible for sequencing the process. The controller entities can be on-chip or off-chip, and the communication between the 2 controller entities is done out-of-band (i.e., not via the HBI). For example, there may be a simple micro-controller on each die, and some message passing interface between the dies (e.g., such as I²C, SPI, or Ethernet).

The HBI activation steps may include initialization, configuration, link training, FIFO training, and link activation. For the initialization step, the HBI logic (including the PHY) is powered up, reset, provided with a stable clock, and taken out of reset and into the idle, inactive state. For the configuration step, runtime programmable features of the HBI may be initialized with desired values. For example, this may include channel direction, parity, DBI, PHY initialization, self-calibration, and redundant wire assignment, etc. For the link training step, each L0 channel configured as output transmits a special training pattern that allows the receiving L0 channel on the other die to center the DQS edge relative to the DQ (data) eye. For the FIFO training step, each L0 channel configured as output transmits a special incrementing pattern that allows the receiving L0 channel on the other die to adjust the receive FIFO such that the FIFO operates near the half full point, providing the most tolerance to jitter. In applications where low latency is desired, the FIFO level may be trained to a different point to reduce latency. For the link activation step, when all previous steps are successfully completed, the data flow may begin. The L1 function may start issuing idle data words and the DQS will toggle continuously. Then user-side traffic can be enabled and real data may start flowing across the HBI.

HBI Clocking

The HBI-based system may operate as a mesochronous network. For example, the HBM-related clocks on both dies (interconnected by the HBI) may run at the same frequency, but with unknown phase relationships. This may be achieved by both die sharing the same reference clock used by the PLL in the HBM PHY (or equivalent).

The transmitted data may be source-synchronous. For example, the clock, or DQS is sent along with the data from transmitter to receiver. In addition, phase and jitter variations may be absorbed in the receive FIFO which is part of the PHY. The HBM channel clock and clock enable signals (CK_t, CK_c, and CKE) may not be used. Long-term jitter variations between the dies may be controlled such that they do not exceed a level which could overflow or underflow the PHY receive FIFO. For example, the long-term jitter of the 1.0 GHz clock may be maintained such that is does not exceed 1 UI (1000 ps).

HBI Power Management

Coarse grain power management for the HBI may be achieved by the external controller entities terminating activity on both die and then powering down the HBI link.

HBI Die to Die Wiring

The HBM micro-bump and bailout arrangement has been selected for ease of routing between the master device and the HBM stack. In HBI systems, when both devices (i.e., the host devices interconnected by the HBI) may have the same orientation of the PHY bailout when placed on the interposer, the die-to-die wiring may be simple. For example, the die-to-die wiring may follow signal routing as in the HBM protocol between master device and HBM stack device. When one die is rotated, wiring becomes more complex. HBI may support both same-orientation, and rotated die cases. FIG. 20 illustrates an example ball layout for HBI following the HBM protocol, with data flowing horizontally from chip to chip. FIG. 21 illustrates an example ball layout for HBI following the HBM protocol for single HBM DWORD using 48 wires, with data flowing vertically from chip to chip. The difference between a master and a slave PHY is only the direction of the unidirectional signals as shown in the Table 2200 in FIG. 22.

When both die have the same orientation, the connections may be 1-to-1 (e.g. DQS is connected to DQS, etc.), with the exception of the WDQS_t/c of one chip may be connected to the RDQS_t/c of the other chip, and vice versa. For example, the read and write DQS may be crossed. The HBI may not use a DERR.

Figure 23A:
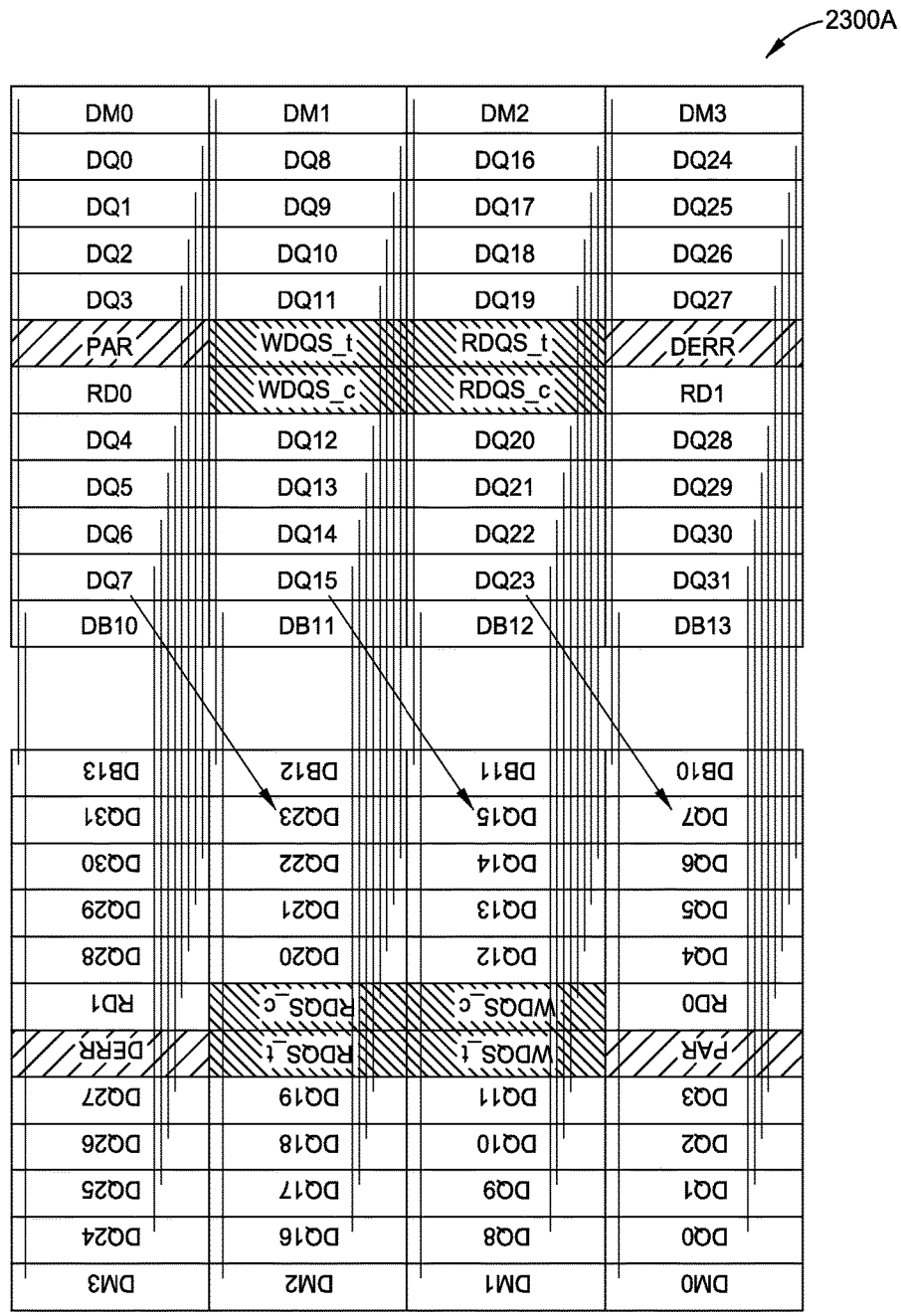

When one die is rotated, maintaining the same wiring may lead to long wires and complex interposer routing. In some examples, the HBI may use a 1-to-1 wiring on the interposer as shown in FIG. 23A and the Table 2300B in the FIG. 23B, with bit reordering done at the L1 module to undo the swapping of bits done on the interposer.

HBI Redundant Data Wires

The HBI may handle redundant data wires according to the HBM standard. The HBM standard defines 8 redundant data wires per 128 data bits, or 2 redundant bits per DWORD. Two lane remapping modes are defined, as detailed below. In HBI, the redundant data wires can be used for lane repair only when both die have the same orientation.

In Mode 1 it is allowed to remap one lane per byte. No redundant pin is allocated in this mode, and DBI functionality is lost for that byte only; however, other bytes continue to support DBI function as long as the Mode Register setting for DBI function is enabled. If the Data Parity function is enabled in the Mode Register and a lane is remapped, both DRAM and host may assume DBI input as "0" for parity calculation for Read and Write operation in this mode. In Mode 1 each byte is treated independently.

In Mode 2, one lane per double byte may be remapped. One redundant pin per double byte is allocated in this mode, and DBI functionality is preserved as long as the Mode Register setting for DBI function is enabled. Two adjacent bytes (e.g. DQ [15:0])) may be treated as a pair (double byte), but each double byte is treated independently.

Certain signals, such as the WDQS_c, WDQS_t, RDQS_c, RDQS_t, PAR, and DERR signals may not be remapped. In mode 1, the DBI signal is lost; so DBI pins cannot be interchangeable with other pins. Therefore for the rotated die case, where DBI is wired to DM, mode 1 may not be used. In mode 2, no functionality is lost but PAR cannot be remapped, so mode 2 may not be used for rotated die.

Example Operations

Figure 24:
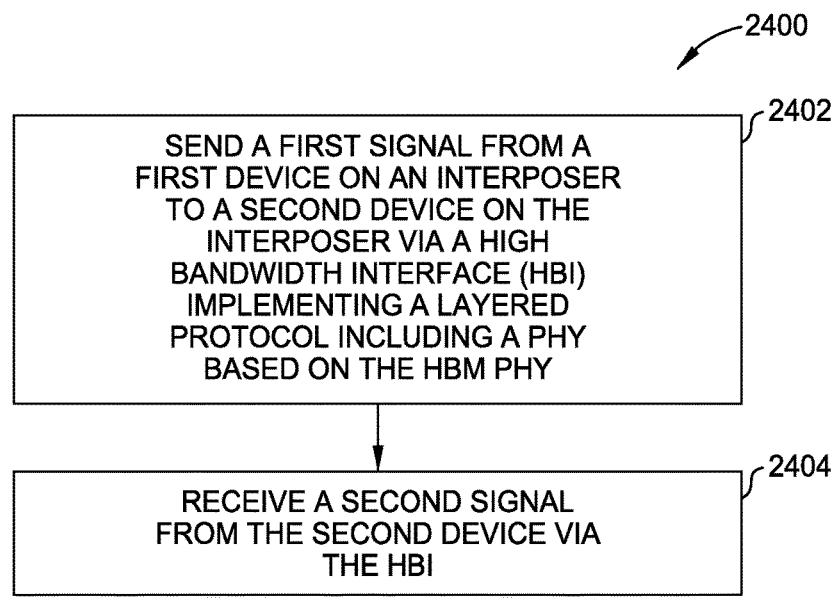
FIG. 24 is a flow diagram illustrating example operations for communication between devices on an interposer according to an example.

FIG. 24 is a flow diagram illustrating example operations 2400 for communication between devices on an interposer. Operations 2400 include, at 2402, sending at least a first signal from a first device on the interposer to a second device on the interposer via a HBI. Sending the first signal via the HBI includes sending the first signal using a layered protocol. The layered protocol includes a physical layer protocol that is configured according to a HBM physical layer protocol. Operations 2400 include, at 2404, receiving at least a second signal from the second device on the interposer via the HBI.

While the foregoing is directed to specific examples, other and further examples may be devised without departing from the basic scope thereof, and the scope thereof is determined by the claims that follow.

What is claimed is:

1. A computing system, comprising:
a first host device comprising a first die on an interposer; and
at least one second host device comprising a second die on the interposer, wherein:
the first host device and the at least one second host device are interconnected via at least one high bandwidth interface (HBI) that implements a layered protocol for communication between the first host device and the at least one second host device, the layered protocol includes a physical layer protocol that is configured according to a high bandwidth memory (HBM) physical layer protocol.

2. The computing system of claim 1, wherein the first and second host devices are each configurable as a master device, a slave device, or both.

3. The computing system of claim 1, wherein the HBI provides a plurality of independent directional channels.

4. The computing system of claim 1, wherein the first host device comprises a 3D programmable integrated circuit (1C), and wherein the at least one second host device comprises an application-specific 1C (ASIC).

5. The computer system of claim 1, wherein the physical layer protocol is configured in a continuous data flow per input/output (I/O) word mode and a 4:1 serializer/deserializer (SERDES) mode.

6. The computer system of claim 1, wherein the layered protocol further includes a transport layer protocol including an output channel configured to issue credits used by an input channel of the transport layer protocol.

7. The computer system of claim 1, wherein the layered protocol further includes a protocol layer comprising a high-level streaming or memory-mapped advanced extensible interface (AXI) protocol.

8. The computer system of claim 7, wherein the memory-mapped AXI protocol includes a 10-bit write strobe signal, wherein a first 5 bits indicate a number of zeros in a first region of the write strobe in which all bits are zero, wherein a second 5 bits indicate a number of ones in a second region of the write strobe in which all bits are one, and wherein the write strobe further comprises a third region in which all bits are zero.

9. The computer system of claim 7, wherein the memory-mapped AXI protocol supports a mixed command channel packet for a simultaneous read command and write command.

10. The computer system of claim 7, wherein the memory-mapped AXI protocol supports a mixed response channel packet for a simultaneous read response and write response.

11. The computer system of claim 1, wherein the first die and the die are connected via a plurality of wires, wherein bumps on the first die are connected to bumps in a corresponding location on the second die, wherein the transport layer is further configured to reorder bits, and wherein the first die and the second die have a same orientation or a different orientation with respect to each other on the interposer.

12. A method for communication between devices on an interposer, comprising:
sending at least a first signal from a first device on the interposer to a second device on the interposer via a high bandwidth interface (HBI), wherein sending the first signal via the HBI comprises sending the first signal using a layered protocol including a physical layer protocol that is configured according to a high bandwidth memory (HBM) physical layer protocol; and
receiving at least a second signal from the second device on the interposer via the HBI.

13. The method of claim 12, wherein the first signal is sent via a first independent directional HBI channel, and wherein the second signal is received via a second directional HBI channel.

14. The method of claim 12, wherein the first device comprises a 3D programmable integrated circuit (IC), and wherein the second device comprises an application-specific IC (ASIC).

15. The method of claim 12, wherein the physical layer protocol is configured in a continuous data flow per input/output (I/O) word mode and a 4:1 serializer/deserializer (SERDES) mode.

16. The method of claim 12, wherein the layered protocol further includes a transport layer protocol including an output channel configured to issue credits used by an input channel of the transport layer protocol.

17. The method of claim 12 wherein the layered protocol further includes a protocol layer comprising a high-level streaming or memory-mapped advanced extensible interface (AXI) protocol.

18. The method of claim 17, wherein the first or second signal comprises a 10-bit write strobe signal, wherein a first 5 bits indicate a number of zeros in a first region of the write strobe in which all bits are zero, wherein a second 5 bits indicate a number of ones in a second region of the write strobe in which all bits are one, and wherein the write strobe further comprises a third region in which all bits are zero.

19. The method of claim 17, wherein the first or second signal comprises a mixed command channel packet for a simultaneous read command and write command.

20. The method of claim 17, wherein the first or second signal comprises a mixed response channel packet for a simultaneous read response and write response.

* * * * *